United States Patent [19]

Hubert et al.

[11] Patent Number: 4,818,358

[45] Date of Patent: Apr. 4, 1989

[54] MAGNETRON CATHODE SPUTTER COATING APPARATUS

[75] Inventors: Peter Hubert, Alzenau; Barbara Kussel, Rodgau; Peter Wirz, Waldernbach, all of Fed. Rep. of Germany

[73] Assignee: Leybold-Heraeus GmbH, Colonge, Fed. Rep. of Germany

[21] Appl. No.: 119,629

[22] Filed: Nov. 12, 1987

[30] Foreign Application Priority Data

Jun. 29, 1987 [DE] Fed. Rep. of Germany ....... 3721373

[51] Int. Cl.$^4$ .............................................. C23C 14/34
[52] U.S. Cl. ................................. 204/298; 204/192.12
[58] Field of Search ............................ 204/298, 192.12

[56] References Cited

U.S. PATENT DOCUMENTS 4,407,713 10/1983 Zega .................................. 204/298
4,437,966 3/1984 Hope et al. .......................... 204/298
4,600,492 7/1986 Ooshio .............................. 204/298

Primary Examiner—Aaron Weisstuch
Attorney, Agent, or Firm—Felfe & Lynch

[57] ABSTRACT

In a cathode sputtering apparatus, in order to achieve a very uniform utilization of the target and a high-quality coating on the substrate, the cathode is provided on its side of the target facing away from the substrate with a flat plate on which a plurality of magnets are disposed in rows, the magnets of the individual rows parallel to one another being at approximately equal distances apart and having the same polarity. Moreover, the magnetic of the one row are offset by a dimension g from the magnets of the adjacent row, so that, in the area of the target provided with the coating material, when the cathode is used in a chamber with suitable gas pressure and with a voltage of any desired frequency is applied, plasma tubes form which are like serpentinely curved racetracks.

16 Claims, 3 Drawing Sheets

MAGNETRON CATHODE SPUTTER COATING APPARATUS

BACKGROUND OF THE INVENTION

The invention relates to a coating apparatus with a high sputtering or deposition rate, having a magnet system in which magnetic lines of force emerging from the cathode face and returning thereto form a discharge area in conjunction with an electrical field.

A cathode sputtering apparatus with a high sputtering rate is already known (German Pat. No. 24 17 288), in which the cathode to be sputtered, which faces the substrate to be sprayed, is plate-shaped, so that the substrate can be moved close to the discharge area across the planar sputtering surface and parallel to the latter, while the magnet system producing the magnetic field is disposed on the side of the cathode facing away from the planar sputtering surface.

This known cathode, however, has the disadvantage that, in the case of very large substrates, such as windowpanes for example, no really satisfactory uniformity of the coating on the substrate can be achieved. Moreover, the ablation of the target is such that only a relatively small proportion of the sputterable material on the target contributes to the formation of the coating on the substrate, since the sputtering of the material is very intensive at narrowly limited portions of the plate-shaped target but takes place hardly at all at portions adjacent thereto.

It is the purpose of the present invention to improve the life of the target and thereby the ablation of the target material and to permit a very uniform coating even of especially large-area substrates. Furthermore, in the case of a plasma-supported CVD process, a good uniformity of the coating thickness on the substrate is to be achieved.

SUMMARY OF THE INVENTION

According to the invention this is accomplished by the fact that a second plate is disposed parallel to the first plate, on the side of the latter facing away from the substrate, and on this second plate two or more rows of a plurality of magnets of the same polarity are held, the magnets of the one row being offset from the magnets of the adjacent row, and the magnets of each row being at about the same distance apart. Instead of rows of magnets disposed parallel to one another, magnets can also be provided according to the invention whose distances apart are different; likewise, instead of a single plate disposed parallel to the first plate, several plates can be provided.

In an especially valuable embodiment, the magnets are permanent magnets and are disposed on the upper side of a second plate facing the plate bearing the material that is to be sputtered, the magnetic counterpole of one magnet being formed by the second plate, such that the lines of force enter and leave from the upper side of the second plate, and the distance between two adjacent magnets being such that the mutual repulsion of the poles of the same sign predominates, in this interval, over the attraction of the second plate.

It is desirable for the permanent magnets fixedly disposed on the second plate to have a bar-like configuration, the individual magnets with a rectangular side surface being joined undisplaceably to the second plate such that the magnetic pole is pointed toward the plate bearing the material to be sputtered.

Preferably, the second plate bearing the magnets and/or the first plate bearing the material to be sputtered is encompassed within an approximately box-like or picture frame-like metal cover forming a dark-space shield, an electrical insulator or an insulating gap being provided between the metal shield and the plates.

Advantageously, the magnet-bearing second plate and/or the metal shield are provided with openings or holes for electrical connecting conductors.

In order to assure a very uniform ablation of the target, a serpentine tubular plasma is formed at each row of magnets by arranging the two adjacent plates in a chamber with an appropriate gas pressure and with an applied cathode voltage of any desired frequency. The tubular plasma of two rows of magnets will then form a serpentine "racetrack."

Lastly, the second plate equipped with magnets can be movable with respect to its mounting or to the dark-space shield, being rotatable, for example, about a perpendicular axis.

BRIEF DESCRIPTION OF THE DRAWING

The invention admits of a great variety of embodiments; one of them is represented diagrammatically in the appended drawings, wherein.

Figure 1:
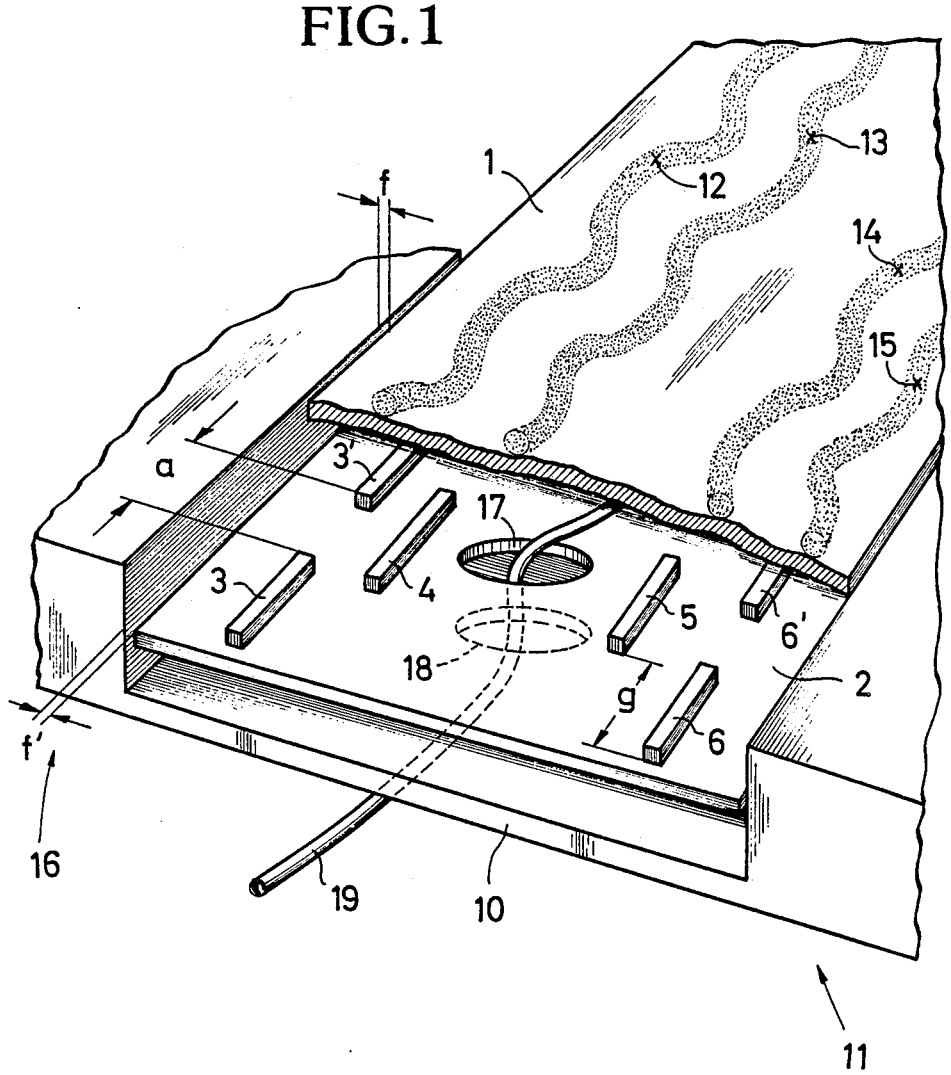
FIG. 1 is a perspective representation of a cathode whose serpentine tubular plasmas are indicated as dotted areas and which otherwise is represented only section-wise.
Figure 2:
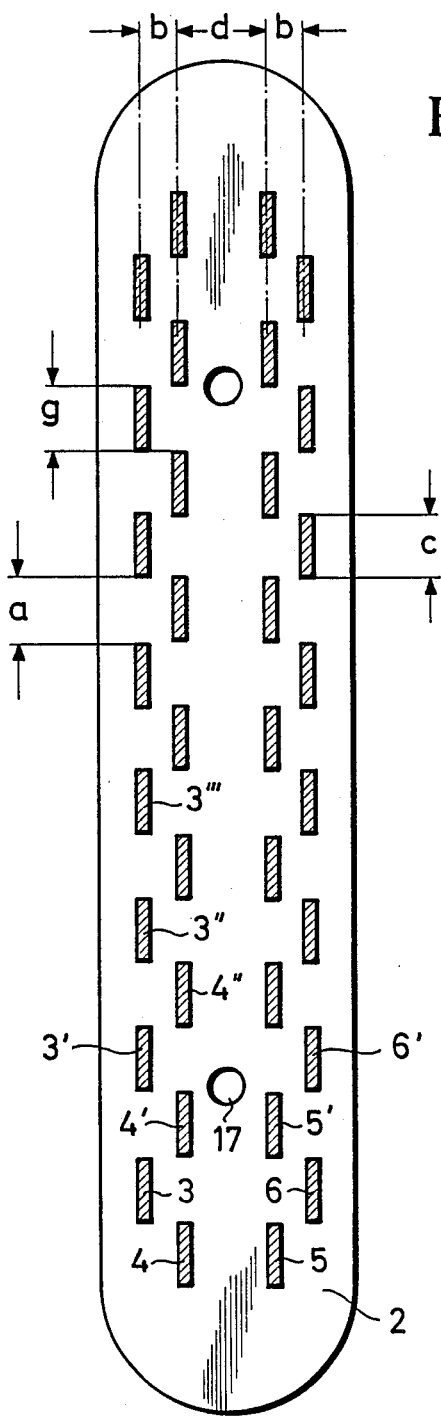
FIG. 2 is a plan view of a plate provided with four rows of magnets.
Figure 3:
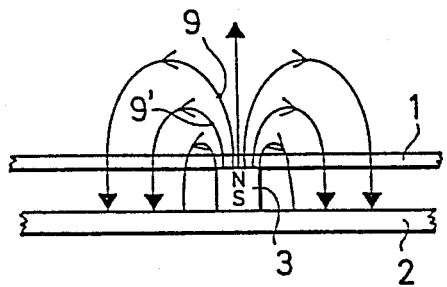
FIG. 3 is a fragmentary section taken transversely through the two adjacent plates of the cathode according to FIG. 1, of which the one bears a magnet and the other the material being sputtered, the course of the magnetic lines of force being indicated by a number of arrows.
Figure 4:
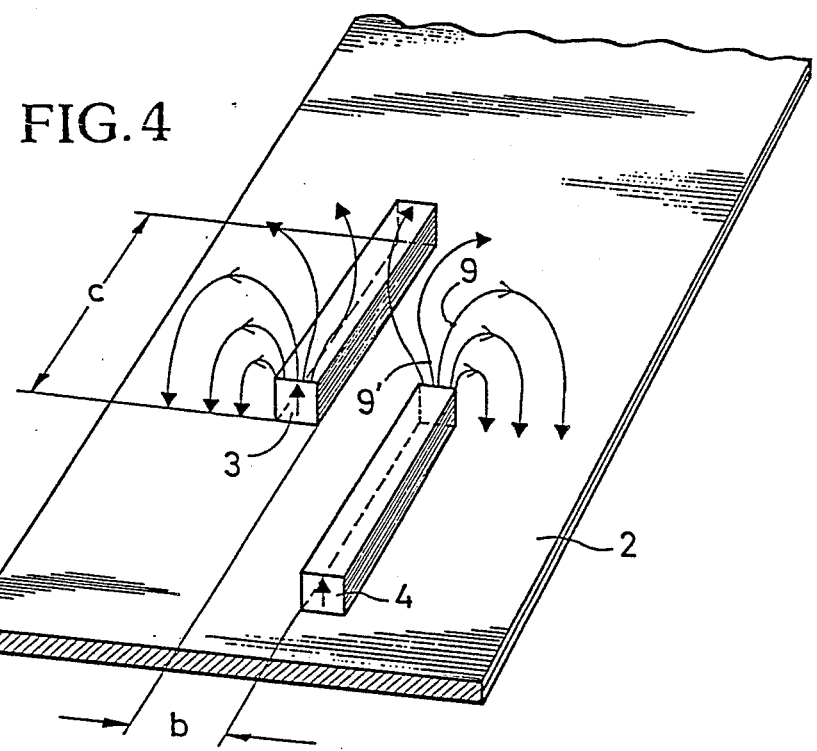
FIG. 4 is a perspective view of a section of the plate bearing the magnets, the course of the magnetic lines of force being indicated by arrows.

The cathode represented in FIG. 1 is disposed within a vacuum chamber and is held on a supporting tube which is not represented and which in turn is attached with insulation to the cover of the vacuum chamber. The workpiece holder holding the substrate or workpiece is provided opposite the cathode and in turn is supported on the base plate of the vacuum chamber. Lastly, an anode is present, which is in the form of a ring held with insulation, and which at least partially surrounds the cathode. The cathode represented in FIGS. 1 to 4 consists substantially of a first plate 1 on which the material being sputtered is situated and which thus forms the so-called target. Parallel to plate 1 there is disposed a magnet holder in the form of a second plate 2 on whose front side a plurality of permanent bar magnets 3, 4 and 5, 6 are provided. Openings 17 and 18 are provided in the second plate 2 and the metal dark space shield 10 for the electrical connection 19. The individual magnets are disposed in a total of four rows side by side, the magnets 3, 3', 3" etc. forming a first row, the magnets 4, 4', 4" etc. a second row, the magnets 5, 5', 5" etc. a third row, and the magnets 6, 6', 6" etc. a fourth row. The individual magnets 3, 3', 3" ... of the first row are arranged at equal intervals a from one another, while the individual magnets 4, 4' ... of the second row are at the same distance a apart but on the other hand they are offset lengthwise of the plate 2 by one magnet length c from the magnets of the first row. In the case represented in FIGS. 1 to 4, the distance a is furthermore selected such that it corresponds to the length c of a magnet 3 to 6, while the distance b between the first row with the magnets 3, 3' . . . and the second row with the magnets 4, 4' . . . is made smaller. Lastly, the distance d between the second row and the third row with the magnets 5, 5' . . . is considerably greater than the distance b between the two rows 1 and 2.

As it is well apparent from the drawings, the bar magnets 3 to 6 are so aligned that their polarity is always the same, so that the lines of force 9, 9' . . . emerge and enter perpendicularly from the upper side of the first plate 1, the distance b between two adjacent magnets being made such (FIG. 4) that the mutual repulsion of poles of the same sign predominates in this interstice over the second plate 2. Both plates 1 and 2 are partially surrounded by a dark space shield 10.

The cathode dark space shield 10 has, like the plates 1 and 2, a generally rectangular shape and is provided with a circumferential flange 16 which extends upwardly an surrounds the periphery of the cathode. The shield 10, 11, 16, is mounted at a distance f, f' from the two plates 1 and 2, the spacers and insulators necessary for this purpose not being shown in the figures. In FIG. 1 the tubular plasmas 12, 13, and 14, 15, which form during the spraying process—the so-called sputtering—are indicated, which are like serpentine racetracks. A serpentine plasma tube can be formed around each two rows of adjacent magnets, given a suitable arrangement of the two adjacent plates in a receptacle with a suitable gas pressure, and the application of a suitable cathode voltage. Since several such racetracks can be provided above a target and the length of the racetracks is increased by their serpentine shape, the described cathode is outstandingly suited for the coating of large-area workpieces or substrates. The result is a completely uniform coating thickness, which furthermore can be applied comparatively quickly, and whose adhesion is unusually good.

With the described apparatus the coating of plate-like substrates can be performed very economically by moving the substrates past the target surface, very close to the discharge area, parallel to the target surface. A high rate of deposition per watt is achieved, even on large-area substrates. Since the target is of a planar configuration, the arrangement of the anode is relatively uncritical, the system producing the magnetic field is disposed on the side of the target facing away from the substrate, and the racetracks can be placed such that overlapping areas of equally intensive sputtering develop, any desired configuration corresponding to the shape of the substrate can be given to the discharge area. Thus, long, narrow cathode surfaces with correspondingly long and narrow discharge areas can easily be realized for the purpose of coating broad substrates moving perpendicularly to the length of the cathode surface, a minimum of space being required. Since the discharge conditions are determined by the number, size and arrangement of the magnets, an extremely uniform deposition is achieved despite the size of the cathode. Various arrangements may be used. For example, one of the permanent magnets fixedly disposed on the second plate may have an annular configuration.

The planar cathodes, however, not only result in a very economical substrate coating, but also they are relatively easy to make, which is important especially when brittle materials which are difficult to machine are used for the cathode. Magnet coils disposed outside of the vacuum chamber and laterally of the substrate can be avoided in the described cathode sputtering apparatus. Coils or permanent magnets disposed on the inside of the vacuum chamber, directly in back of the cathode can not only be accommodated in less space, but they also assure higher field strengths with low currents.

What is claimed is:

1. Coating apparatus with a high sputtering rate, with a magnet system in which magnetic lines of force emerging from the cathode surface and returning thereto form a discharge area in conjunction with an electrical field, characterized in that on the side of a first plate facing away from a substrate, and parallel thereto, a second plate is disposed, on which two or more parallel rows of a plurality of magnets of the same polarity are affixed, the magnets of a first row being disposed offset from the magnets of an adjacent row, and the magnets of each row being about a same distance apart.

2. Coating apparatus according to claim 1, characterized in that the magnets are in the form of permanent magnets and are disposed on the upper side of the second plate facing the plate bearing material to be sputtered or the plate bearing the substrate to be coated from the gas phase, the magnetic counterpole of each magnet being formed by the second plate such that the lines of force enter and leave from the upper side of the first plate, while the distance between two adjacent magnets is such that the mutual repulsion of the poles of like sign in this connection predominates over the attraction of the second plate.

3. Coating apparatus according to claim 2, characterized in that the permanent magnets affixed to the second plate have a bar-shaped configuration, the, individual magnets having a rectangular side surface to the second plate such that the magnetic pole faces the plate bearing the material that is to be sputtered.

4. Coating apparatus according to claim 1, characterized in that the second plate bearing the magnets and/or the first plate bearing the material to be sputtered, are surrounded by an approximately box-shaped or flame-like grounded metal shield, an electrical insulator or an insulating gap being provided between the metal shield and the plates.

5. Coating apparatus according to claim 4, characterized in that the plate bearing the magnets and/or the metal shield has openings or holes for electrical connecting lines.

6. Coating apparatus according to claim 4, characterized in that the second plate equipped with magnets is movable in relation to the shield.

7. Coating apparatus according to claim 1, characterized in that the two plates are disposed in a receptacle adapted to provide a suitable gas pressure so that the application of a suitable cathode voltage produces a serpentine plasma tube around each two rows of adjacent magnets, said plasma tube forming a serpentinely winding continuous racetrack.

8. Coating apparatus according to claim 1, characterized in that at least one of the permanent magnets affixed to the second plate has an annular configuration.

9. Coating apparatus with a high sputtering or deposition rate, with a magnet system in which magnetic lines of force emerging from a cathode surface and returning thereto form a discharge area in conjunction with an electrical field, characterized in that on a side of a first plate facing away from the substrate, and parallel thereto, additional plates are disposed on which magnets are affixed, the magnets being at different intervals apart and having the same polarity.

10. Coating apparatus according to claim 9, characterized in that the magnets are in the form of permanent magnets and are disposed on the upper side of a second plate facing the plate bearing material to be sputtered or the plate bearing the substrate to be coated from the gas phase, the magnetic counterpole of the magnet being formed by the second plate such that the lines of force enter and leave from the upper side of the first plate, while the distance between two adjacent magnets is such that the mutual repulsion of the poles of like sign in this connection predominates over the attraction of the second plate.

11. Coating apparatus according to claim 10, characterized in that the permanent magnets affixed to the second plate have a bar-shaped configuration, the individual magnets having a rectangular side surface affixed to the second plate such that the magnetic pole faces the plate bearing the material that is to be sputtered.

12. Coating apparatus according to claim 10, characterized in that the second plate bearing the magnets and/or the first plate bearing the material to be sputtered, are surrounded by an approximately box-shaped or frame-like grounded metal shield, an electrical insulator or an insulating gap being provided between the metal shield and the plates.

13. Coating apparatus according to claim 12, characterized in that the plate bearing the magnets and/or the metal shield has openings or holes for electrical connecting lines.

14. Coating apparatus according to claim 10, characterized in that the second plate equipped with magnets is movable in relation to its mounting or its dark-space shield.

15. Coating apparatus according to claim 10, characterized in that at least one of the permanent magnets affixed to the second plate has an annular configuration.

16. Coating apparatus according to claim 9, characterized in that the two plates are disposed in a receptacle adapted to provide a suitable gas pressure so that the application of a suitable cathode voltage produces a serpentine plasma tube around each two rows of adjacent magnets plasma tube forming a serpentinely winding continuous racetrack.

* * * * *

UNITED STATES PATENT AND TRADEMARK OFFICE
CERTIFICATE OF CORRECTION

PATENT NO. : 4,818,358
DATED : April 4, 1989
INVENTOR(S) : Peter Hubert, et al.

It is certified that error appears in the above-identified patent and that said Letters Patent is hereby corrected as shown below:

Column 3, line 23, "an surrounds" should be --and surrounds--;

Abstract, line 10, "the magnetic of the" should be --the magnets of the--.

Signed and Sealed this

Thirtieth Day of January, 1990

Attest:

JEFFREY M. SAMUELS

Attesting Officer     Acting Commissioner of Patents and Trademarks